United States Patent [19]

Tanaka et al.

[11] Patent Number: 5,053,643
[45] Date of Patent: Oct. 1, 1991

[54] INTEGRATED CIRCUIT INCLUDING OUTPUT CIRCUIT HAVING INPUT LOGIC CONTROLLED BY OUTPUT LOGIC

[75] Inventors: Masahiro Tanaka, Kawasaki; Shinichi Shiotsu, Hachioji, both of Japan

[73] Assignee: Fujitsu Limited, Kawasaki, Japan

[21] Appl. No.: 426,040

[22] Filed: Oct. 24, 1989

[30] Foreign Application Priority Data

Oct. 27, 1988 [JP] Japan ................. 63-271350

[51] Int. Cl.$^5$ ................. H03B 1/04; H03K 5/00
[52] U.S. Cl. ................. 307/443; 307/458; 307/264; 307/547; 307/563; 361/91; 361/101
[58] Field of Search ........... 307/443, 457, 458, 263, 307/264, 546, 547, 549, 562, 563; 361/91, 101

[56] References Cited

U.S. PATENT DOCUMENTS

| | | | |
|---|---|---|---|
| 4,132,906 | 1/1979 | Allen | 307/443 |
| 4,394,588 | 7/1983 | Gaudenzi | 307/443 |
| 4,721,869 | 1/1988 | Okado | 307/592 |
| 4,737,665 | 4/1988 | Ovens | 307/458 |
| 4,791,314 | 12/1988 | Kuo et al. | 307/270 |
| 4,897,566 | 1/1990 | Kitora et al. | 307/443 |
| 4,916,572 | 4/1990 | Guajardo | 361/91 |
| 4,931,669 | 6/1990 | Higashisaka | 307/443 |
| 4,931,673 | 6/1990 | Naghshineh | 307/443 |

FOREIGN PATENT DOCUMENTS 2000993 7/1971 Fed. Rep. of Germany .
3411900A1 10/1985 Fed. Rep. of Germany .

OTHER PUBLICATIONS

P. Naser, Radio Fernsehen Electronik, vol. 30, No. 10, 1981, Berlin DDR.
F. X. Delaporte et al., "Additional Protection Circuit for a Monolithic EIA Driver", IBM Technical Disclosure Bulletin, vol. 25, No. 9, Feb. 1983, pp. 4891-4893, New York, U.S.
European Search Report for EP-89-11-9746, The Hague, Apr. 24, 1990.

Primary Examiner—Timothy P. Callahan
Attorney, Agent, or Firm—Staas & Halsey

[57] ABSTRACT

An integrated circuit includes an output circuit, a conducting circuit, a trigger voltage generator and a connecting circuit. The output circuit has an input terminal and an output terminal and sets the output terminal to a high potential corresponding to logic "1" when the potential applied to the input terminal corresponds to logic "0". On the other hand, when the potential applied to the input terminal corresponds to logic "1", the output circuit sets the output terminal to a low potential corresponding to logic "0". The conducting circuit conducts and passes a current from the output terminal when the potential of the output terminal becomes equal to a predetermined potential higher than the high potential. The trigger voltage generator generates a trigger voltage proportional to the current passing through the conducting circuit when it conducts. The connecting circuit sets the potential of the input terminal of the output circuit to the low level corresponding to logic "0" when the trigger voltage is applied to the connecting circuit.

16 Claims, 5 Drawing Sheets

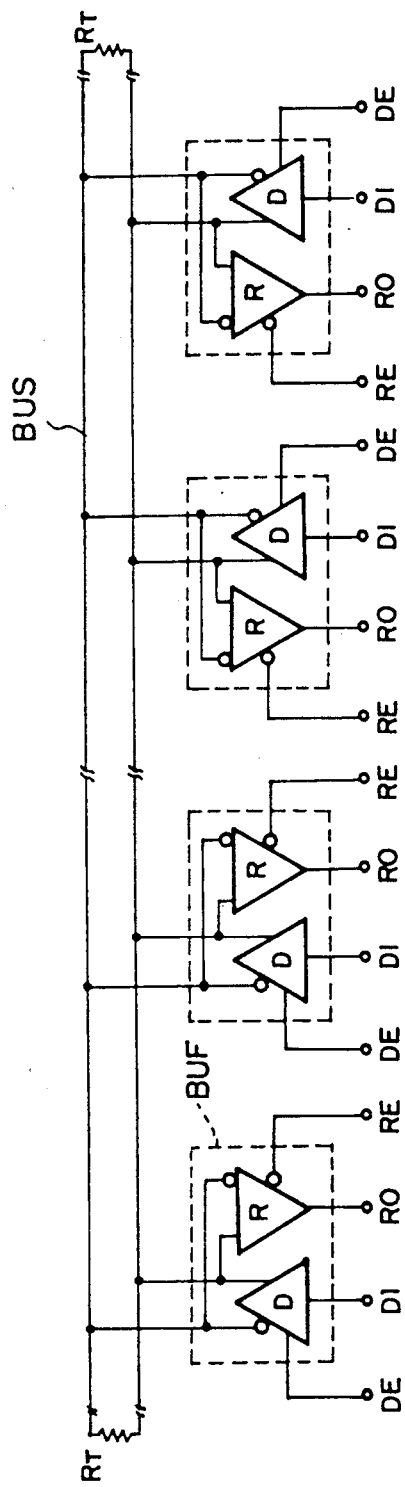
FIG. 5
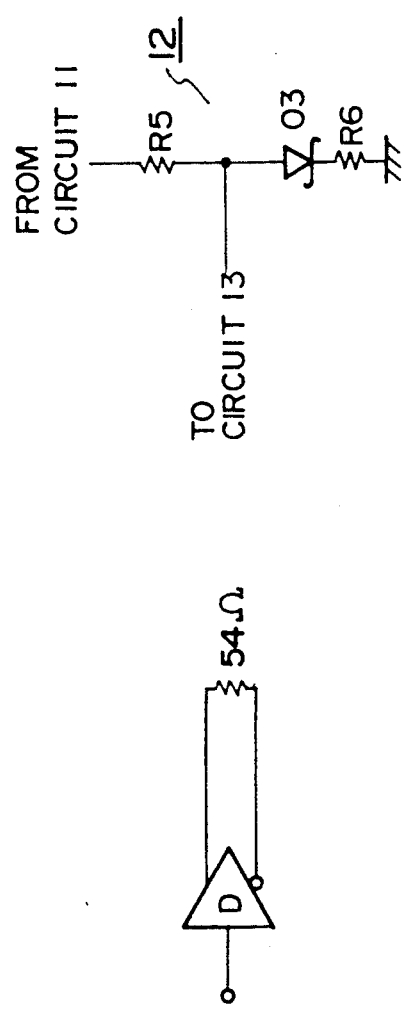
FIG. 8
FIG. 6

INTEGRATED CIRCUIT INCLUDING OUTPUT CIRCUIT HAVING INPUT LOGIC CONTROLLED BY OUTPUT LOGIC

BACKGROUND OF THE INVENTION

The present invention generally relates to an integrated circuit having an output circuit, and more particularly to an integrated circuit having an output circuit which is coupled to a bus or a transmission line.

Recently, there has been considerable activity in the development of a system such as a local area network in which a plurality of bus receivers and bus transmitters hold a bidirectional bus in common. In such a system, it is desired that data is exchanged at high speeds between the bidirectional bus and the bus receivers or transmitters. Further, the bus receivers or bus transmitters must be protected from an overvoltage (between a recommended operation voltage and a maximum rated voltage) applied thereto through the bidirectional bus.

FIG. 1 is a circuit diagram of a conventional output circuit which serves as a bus transmitter. Referring to FIG. 1, an output circuit 1 is made up of transistors Q1–Q5, a diode (Schottky diode) D1, and resistors R1 and R2. Each of the transistors Q1, Q3 and Q4 includes a Schottky diode. The transistors Q1 and Q2 and the diode D1 form a first switching circuit 2. A second switching circuit 3 includes the transistor Q3. A binary logic signal S1 supplied from an input circuit or an internal circuit (not shown) of a device related to the output circuit 1 is applied to the base of the transistor Q4. In response to the binary logic signal S1, the transistor Q4 turns ON either the first switching circuit 2 or the second switching circuit 3. When the first switching circuit 2 is turned ON, the level of an output terminal X is set approximately equal to a power source voltage Vcc. On the other hand, when the second switching circuit 3 is turned ON, the level of the output terminal X is set approximately equal to a ground potential (GND). The resistor R1 generates a voltage proportional to an emitter current passing through the transistor Q3. The generated voltage is applied to the base of the transistor Q5 and causes the base voltage of the transistor Q5 to increase. Accordingly, the emitter current of the transistor Q3 decreases as an increase of the base voltage of the transistor Q5.

That is, when the binary logic signal S1 is switched to logic "0", the transistor Q4 turns OFF, and the transistors Q1 and Q2 of the first switching circuit 2 turn ON. Thereby, the logic of the output terminal X is set to logic "1" (equal to Vcc - 2$V_{BE}$). On the other hand, when the binary logic signal S1 is switched to logic "1", the transistor Q4 turns ON and the transistor Q3 of the second switching circuit 3 turns ON. Thereby, the logic of the output terminal X is set to logic "0" (approximately equal to the ground potential). When an overvoltage is applied to the output terminal X with the transistor Q3 ON, the transistor Q5 suppresses the emitter current of the transistor Q3 so that the transistor Q3 can be prevented from being broken down.

The resisting voltage of the output circuit 1 viewed from the output terminal X is based on characteristics of the transistors Q1–Q5. Particularly, the resisting voltage of the output circuit is mainly based on the reverse emitter-base breakdown voltage $BV_{EBO}$ of each of the transistors Q1 and Q2 when the logic of the output terminal X is "0". For this reason, the conventional output circuit does not satisfy the maximum rating defined by a standard such as RS485 in the EIA (Electronic Industries Association) standard.

The above-mentioned RS485 standard is frequently applied to a bus receiver and a bus transmitter which hold a bidirectional bus in common. The recommended operating condition of the RS485 standard is equal to or less than 12 volts. The maximum rating which is generally applied to integrated circuits in conformity with the RS485 standard is equal to or less than 15 volts.

Output resisting (breakdown) voltages $BV_{OH}$ and $BV_{OL}$ for logics H and L are described by the following formulas (1) and (2), respectively:

$$BV_{OH} = Vcc + BV_{EB01} + BV_{EB02} \quad (1)$$
$$\approx 5V + 5.5V + 5.5V$$
$$= 16V$$

$$BV_{OL} = V_{BE5} + V_{BE3} + V_{CE4} + V_{EB01} + V_{EB02} \quad (2)$$
$$\approx 0.8V + 0.8V + 0.4V + 5.5V + 5.5V$$
$$\approx 13V$$

where $V_{BE5}$ is the forward base-emitter voltage of the transistor Q5, $V_{BE3}$ is the forward base-emitter voltage of the transistor Q3, $V_{CE4}$ is the forward collector-emitter saturation voltage of the transistor Q4, the $BV_{EB01}$ is the reverse emitter-base breakdown voltage of the transistor Q1, and $BV_{EB02}$ is the reverse emitter-base breakdown voltage of the transistor Q2.

The output resisting voltage $BV_{OH}$ equal to 16 volts sufficiently satisfies the maximum rating equal to 15 volts. On the other hand, the output resisting voltage $BV_{OL}$ equal to 13 volts does not satisfy the maximum rating. Therefore, when an overvoltage in excess of the recommended operating condition under the maximum rating is applied to the output terminal X from the outside of the output circuit 1 in the state where the output logic of the output circuit 1 is "0", the transistors Q1 and Q2 may be broken down. In order to get rid of this possibility, it is conceivable to deep base diffusion for the transistors Q1 and Q2 so that the voltages $BV_{EB01}$ and $BV_{EB02}$ can be increased so as to satisfy the RS485 standard. However, such an idea presents another disadvantage in that signal transmission becomes slow as the base diffusion is deepened.

SUMMARY OF THE INVENTION

Accordingly, a general object of the present invention is to provide a novel and useful integrated circuit having an output circuit in which the aforementioned disadvantages are eliminated.

A more specific object of the present invention is to provide an integrated circuit having an output circuit which satisfies a maximum rating which is generally applied to integrated circuits in conformity with the RS485 standard.

The above objects of the present invention can be achieved by an integrated circuit having an output circuit, a conducting circuit, a trigger voltage generator and a connecting circuit. The output circuit has an input terminal and an output terminal and sets the output terminal to a high potential corresponding to logic "1" when the potential applied to the input terminal corresponds to logic "0". On the other hand, when the potential applied to the input terminal corresponds to logic "1", the output circuit sets the output terminal to a low potential corresponding to logic "0". The conducting circuit conducts and passes a current from the output circuit when the potential of the output terminal becomes equal to a predetermined potential higher than the high potential. The trigger voltage generator generates a trigger voltage proportional to the current passing through the conducting circuit when it conducts. The connecting circuit sets the potential of the input terminal of the output circuit to the low level corresponding to logic "0" when the trigger voltage is applied to the connecting circuit.

Additional objects, features and advantages of the present invention will become apparent from the following detailed description when read in conjunction with the accompanying drawings.

BRIEF DESCRIPTION OF THE DRAWINGS

FIG. 5 is a block diagram of a local area network to which the present invention can be applied;

FIG. 6 is a circuit diagram illustrating an equivalent circuit of an output circuit following the output circuit;

FIG. 8 is a circuit diagram of a trigger voltage generator used in the present invention.

DESCRIPTION OF THE PREFERRED EMBODIMENTS

Figure 2:
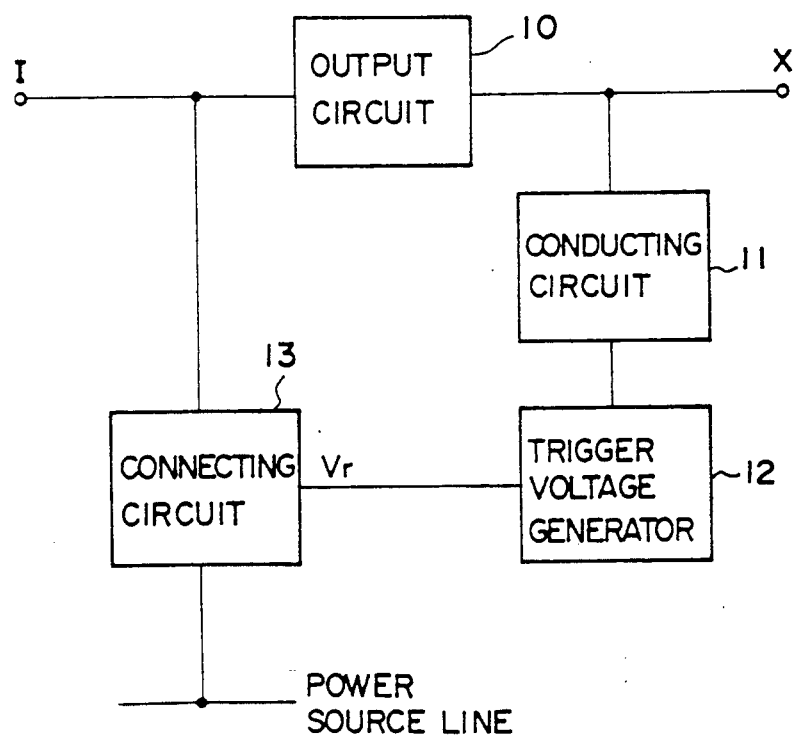
FIG. 2 is a block diagram illustrating the principle of the present invention.

A description is given of the principle of the present invention with reference to FIG. 2. Referring to FIG. 2, an output circuit 10 sets an output terminal X to be a high potential corresponding to logic "1" when the potential of an input terminal I corresponds to logic "0". On the other hand, when the potential of the input terminal I corresponds to logic "1", the output circuit 10 sets the output terminal X to be a low potential corresponding to logic "0". A conducting circuit 11 conducts when the potential of the output terminal X becomes equal to a predetermined high voltage higher than the aforementioned high potential. A trigger voltage generator 12 is connected to the output terminal X through a conducting circuit and generates a trigger voltage VT proportional to the predetermined high voltage (or a current passing therethrough) when the conducting circuit 11 conducts. A connecting circuit 13 connects the input terminal I to a power source line of a potential corresponding to logic "0" when the trigger voltage VT is applied to the connecting circuit 13.

In operation, when an overvoltage is applied to the output circuit 10 through the output terminal X, the logic of the output terminal X is intentionally set to "1". Thus, the resisting voltage of the output circuit 10 is increased from to $BV_{OL}$ to $BV_{OH}$. For example, the resisting voltage is increased by 3 volts when $BV_{OL}=13$ volts and $BV_{OH}=16$ volts. Hence, the present output circuit can satisfy the specification of the RS485 standard (the maximum rating is equal to or less than 15 volts). It is noted that the logic of the output terminal X is not ensured when it is intentionally set to "1". However, in this case, it is sufficient to protect the output circuit from breakdown due to an overvoltage.

Figure 3:
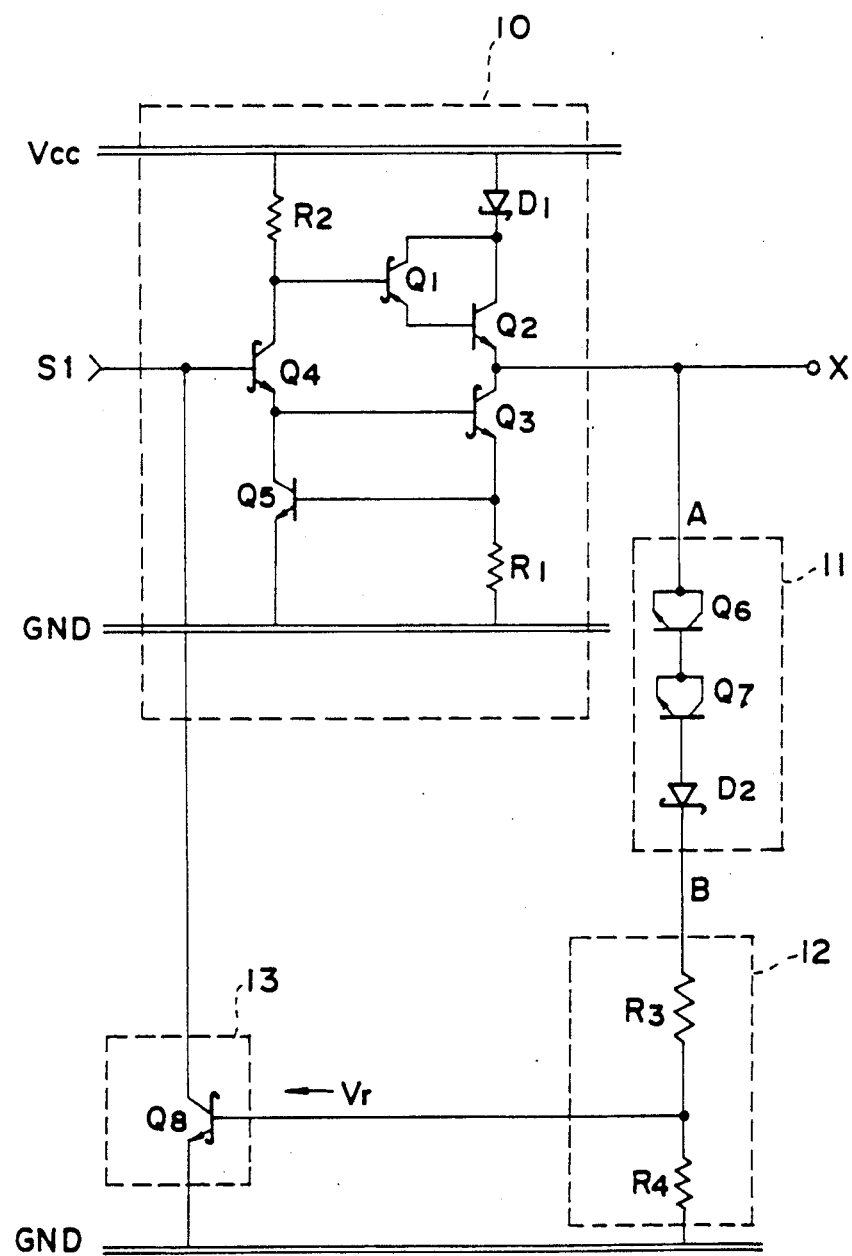
FIG. 3 is a circuit diagram of a preferred embodiment of the present invention.

A description is given of a preferred embodiment of the present invention with reference to FIG. 3, in which those parts which are the same as those in FIG. 2 are given the same reference numerals.

Figure 1:
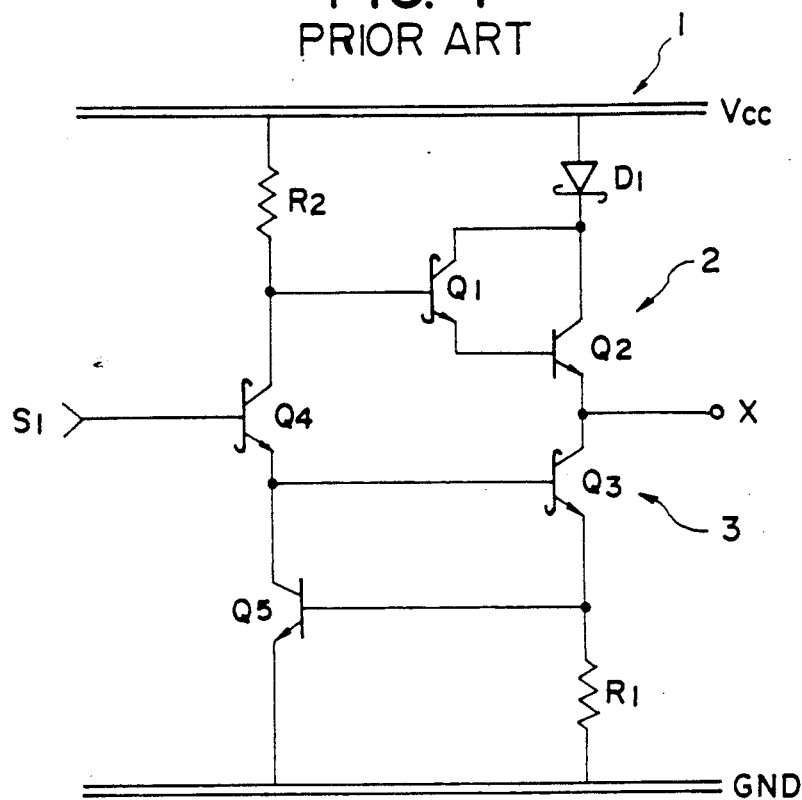
FIG. 1 is a circuit diagram of a conventional output circuit.

The output circuit 10 is of the same structure as the output circuit shown in FIG. 1. That is, the output circuit 10 includes the transistors Q1-Q5, diode D1, and resistors R1 and R2. The conducting circuit 11 having an end A connected to the output terminal X, and an end B coupled to ground through the trigger voltage generator 12. The conducting circuit 11 is made up of transistors Q6, Q7 and a Schottky diode D2 which are connected in series between the ends A and B. The collector and emitter of each of the transistors Q6 and Q7 are mutually connected. The base of the transistor Q6 is connected to the emitter and collector of the transistor Q7. The base of the transistor Q7 is connected to the anode of the Schottky diode D2. The cathode of the Schottky diode D2 corresponds to the end B of the conducting circuit 11. The trigger voltage generator 12 is composed of series-connected resistors R3 and R4. When the conducting circuit 11 conducts, the trigger voltage generator 12 is connected to the output terminal X through the conducting circuit 11. The trigger voltage generator 12 generates a voltage proportional to the potential of the output terminal X, that is, the trigger voltage $V_T$ across the resistor R4. The conducting circuit 11 conducts when the voltage between the ends A and B exceeds a predetermined high voltage (conducting potential) Vx. The predetermined high voltage Vx is equal to the sum of the reverse emitter-base breakdown voltages $BV_{EB06}$ and $BV_{EB07}$ of the transistors Q6 and Q7 and the forward voltage $V_{F2}$ of the diode D2. The connecting circuit 13 is formed by a transistor Q8 having a Schottky diode. The node of the resistors R3 and R4 is connected to the base of the transistor Q8. When the trigger voltage $V_T$ derived from the trigger voltage generator 12 is applied to the base of the transistor Q8, it turns ON and connects the input of the output circuit 10 to a power source line of a potential corresponding to logic "0", e.g., a ground line GND. When the logic of the input of the output circuit 10 is set to logic "0", the output logic of the logic circuit 10 is switched to logic "1".

In operation, the potential of the output terminal X of the output circuit 10 changes according to the logic of the input terminal I. When the input logic is "0", the potential of the output terminal X is a high potential (about Vcc) corresponding to logic "1". On the other hand, when the input logic is "1", the potential of the output terminal X is a low potential (about ground potential). Since the potential of the output terminal X changes within a range between Vcc potential and ground potential, the resisting voltage of the output circuit 10 is sufficiently ensured.

It is now assumed that an overvoltage due to a certain reason is applied to the output terminal X from the outside. No problem arises from an overvoltage which is less than the aforementioned voltage $BV_{OL}$. On the other hand, when the overvoltage exceeds the aforementioned voltage $BV_{OH}$, there is a possibility that the transistors Q1 and Q2 of the aforementioned conventional output circuit shown in FIG. 1 may be broken down. On the other hand, according to the present embodiment, when the potential of the output terminal exceeds the voltage $BV_{OL}$, the conducting circuit 11 is immediately allowed to conduct. Thus, there is no possibility that the transistors Q1 and Q2 are broken down.

The conducting potential Vx at which the conducting circuit 11 is allowed to conduct is set as follows:

$$Vx = EB_{06} + BV_{EB07}V_{F2} \quad (3)$$

where $V_{F2}$ is the forward voltage of the diode D2. It can be seen from formula (2) that the conducting potential Vx is set slightly less than the voltage $BV_{OL}$. The following matter can be seen from a comparison between the formulas (2) and (3). Generally, $BV_{EB01} = BV_{EB02} = BV_{EB06} = BV_{EB07} = 5.5$ volts. Therefore, the conducting potential Vx is less than the voltage $BV_{OL}$ by the difference between the voltage $V_F$ and the sum of $V_{BE5}$, $V_{BE3}$ and $V_{CE4}$. Therefore, the the trigger voltage generator 12 conducts immediately just before the potential of the output terminal X exceeds the voltage $BV_{OL}$. Then the trigger voltage $V_T$ is generated across the resistor R4 of the trigger voltage generator 12. In response to the trigger voltage $V_T$, the transistor Q8 turns ON. Thereby, the base potential of the transistor Q4 is set approximately equal to the ground potential GND and the output terminal X of the output circuit 10 is intentionally set to be logic "1". As a result, the resisting voltage of the output circuit 10 viewed from the output terminal X is increased up to the voltage $BV_{OH}$ from the voltage $BV_{OL}$ (13V→16V) so that the output circuit 10 can satisfy a maximum rating of 15 volts or less enough to satisfy recommended operating voltage specification (12V or less) of RS485 of the EIA standard.

Figure 4A:
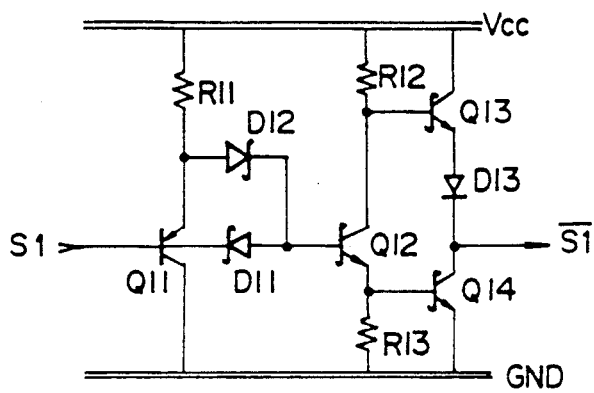
FIG. 4A is a circuit diagram of an inverting type TTL gate circuit, which can be connected to an input of the output circuit.
Figure 4B:
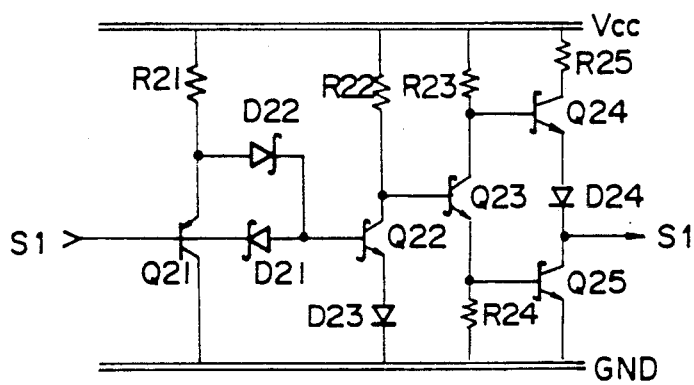
FIG. 4B is a circuit diagram of a non-inverting type TTL gate circuit, which can be connected to an input of the output circuit.
Figure 4C:
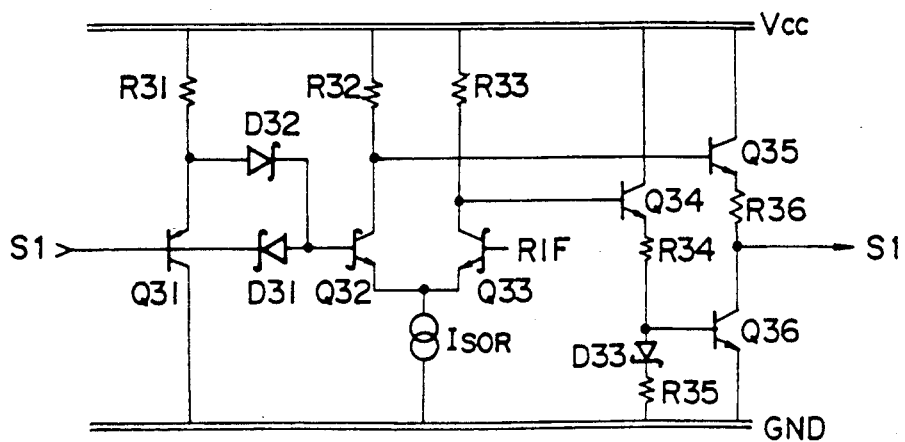
FIG. 4C is a circuit diagram of a non-inverting type gate circuit, which includes a differential circuit.

The output circuit shown in FIG. 3 is driven by an internal circuit as shown in FIGS. 4A, 4B or 4C. Referring to FIG. 4A, there is illustrated an inverting type TTL (transistor-transistor logic) gate circuit. The gate circuit shown in FIG. 4A is made up of transistors Q11–Q14, diodes D11–D13, and resistors R11–R13. An input signal S1 is applied to the base of the transistor Q11, and an inverted signal S1 is drawn from the collector of the transistor Q14.

FIG. 4B shows a non-inverting type TTL gate circuit. As shown, the gate circuit is made up of transistors Q21–Q25, diodes D21–D24, and resistors R21–R25. The input signal S1 is applied to the base of the transistor Q21, and the non-inverting signal S1 is drawn from the collector of the transistor Q25.

FIG. 4C illustrates a gate circuit which includes a differential amplifier. As shown, the gate circuit is made up of transistors Q31–Q36, diodes D31–D33, and resistors R31–R36. The transistors Q32 and Q33 form the differential amplifier. A reference signal is applied to the base of the transistor Q33, and the input signal S1 is applied to the base of the transistor Q31. The corresponding signal S1 is drawn from the collector of the transistor Q36.

FIG. 5 shows a configuration of a local area network. A plurality of bidirectional buffers BUF are coupled to a bidirectional bus BUS. Each of the bidirectional buffers BUF consists of a bus driver (transmitter) D and a bus receiver R. The bus driver D inputs a data D1 and outputs a pair of output signals D1 and D1 (OR/NOR). That is, the bus driver D is of a balanced type. When a driver enable signal DE is applied to the bus driver D, it is made active.

The bus driver D is formed using the output circuit 10 according to the present invention. For example, the bus driver D is composed of a first output circuit as shown in FIG. 2 following the gate circuit shown in FIG. 4A, and a second output circuit as shown in FIG. 2 following the gate circuit shown in FIG. 4B. The output terminals X of the two output circuits are connected to a resistor of 54 ohms as shown in FIG. 6.

Figure 7:
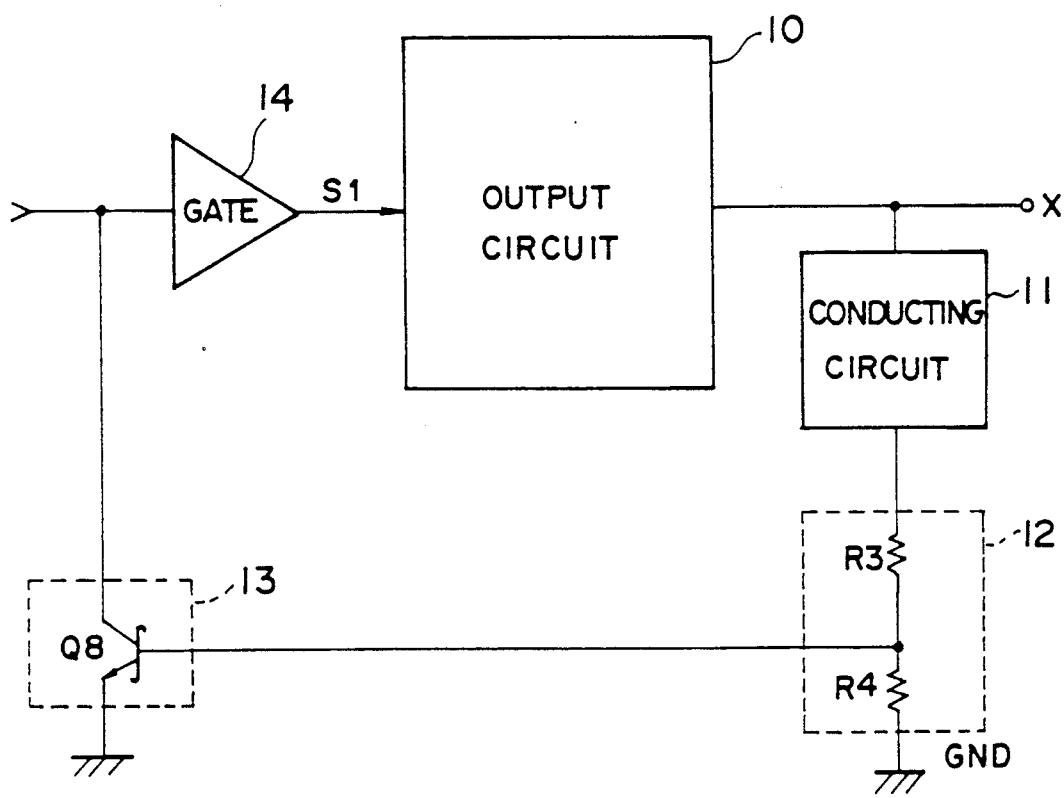
FIG. 7 is a block diagram of a second preferred embodiment of the present invention.

A description is given of a second embodiment of the present invention with reference to FIG. 7, in which those parts which are the same as those are given the same reference numerals. A non-inverting type TTL gate circuit 14 is provided between the connecting circuit 13 and the output circuit 10. It is noted that the output signal derived from the connecting circuit 13 is not supplied directly to the output circuit 10 but the non-inverting type gate circuit 14. When the trigger voltage $V_T$ is applied to the connecting circuit 13, the connecting circuit 13 intentionally sets the input logic for the gate circuit 14 low. Immediately, the output logic of the gate circuit 14, that is, the input logic of the output circuit 10 is set low. Thus, the output logic of the output circuit 10 is set high.

In each of the first and second embodiments, the conducting circuit 11 is not limited to the illustrated configuration. For example, the conducting circuit 11 is formed by only diodes or transistors. The number of transistors or diodes is not limited to the number of the illustrated transistors or diodes.

FIG. 8 shows an alternative configuration of the trigger voltage generator 12. The alternative is made up of resistors R5, R6 and a Schottky diode D3. The node between the resistor R5 and the Schottky diode D3 is connected to the base of the transistor Q8 of the connecting circuit 12.

The present invention is not limited to the aforementioned embodiments, and variations and modifications may be made without departing from the scope of the present invention.

What is claimed is:

1. An integrated circuit comprising:
   an output means, having an input terminal and an output terminal, to provide a current, for setting said output terminal to a high potential corresponding to logic "1" when the potential applied to said input terminal corresponds to logic "0" and setting said output terminal to a low potential corresponding to logic "0" when the potential applied to said input terminal corresponds to logic "1";
   conducting means, coupled to said output terminal of the output means, for conducting the current when the potential of said output terminal becomes equal to a predetermined potential, the predetermined potential being higher than the high potential;
   trigger voltage generating means, coupled to said conducting means, for generating a trigger voltage proportional to the current when said conducting means conducts; and
   setting means, coupled to said trigger voltage generating means and said output means, for setting the potential of said input terminal of the output means to the low potential corresponding to logic "0" when the trigger voltage is applied to said setting means.

2. An integrated circuit as claimed in claim 1, wherein said setting means includes connecting means for connecting said input terminal of the output means to a power source line of a potential corresponding to logic "0".

3. An integrated circuit as claimed in claim 1, wherein said conducting means includes a transistor having an emitter and the collector mutually connected and a base, and the current passes from said mutually connected emitter and collector to said base.

4. An integrated circuit as claimed in claim 1, wherein said conducting means includes a diode.

5. An integrated circuit as claimed in claim 1, wherein said conducting means includes a series circuit including a transistor and a diode connected in series.

6. An integrated circuit as claimed in claim 1, wherein said trigger voltage generating means includes at least two resistors connected in series, and said trigger voltage is drawn from a node of adjacent resistors of said trigger voltage generating means.

7. An integrated circuit as claimed in claim 1, wherein said trigger voltage generating means includes a first resistor, a diode and a second resistor which are connected in series, and said trigger voltage is drawn from a node of said first resistor and said diode.

8. An integrated circuit as claimed in claim 1, wherein said setting means includes a transistor having a collector connected to said input terminal of said output means, an emitter supplied with said low potential corresponding to logic "0", and a base to which said trigger voltage derived from said trigger voltage generating means is applied.

9. An integrated circuit as claimed in claim 8, wherein said transistor comprises a Schottky transistor.

10. An integrated circuit as claimed in claim 4, wherein said diode comprises a Schottky diode.

11. An integrated circuit as claimed in claim 1, wherein said output means includes drive means for generating a non-inverting signal based on the potential of said input terminal of the output means, and logic means for setting said output terminal to the high potential corresponding to logic "1" when said non-inverting signal corresponds to logic "0" and for setting said output terminal to the low potential corresponding to logic "0" when the non-inverting signal corresponds to logic "1".

12. An integrated circuit as claimed in claim 1, wherein said output terminal of the output means is coupled to a bus.

13. An integrated circuit as claimed in claim 1, wherein said predetermined potential is lower than a resisting voltage of said output means defined when said output terminal is logic "0".

14. An integrated circuit according to claim 3, wherein said conducting means further comprises a diode connected in a back-to-back relationship with said transistor.

15. An integrated amount as claimed by claim 1, wherein said conducting means further comprises switching means for conducting and passing the current from said output means when the potential of said output terminal becomes greater than the predetermined potential and blocking the current from said output means when the potential of said output terminal becomes less than the predetermined potential.

16. An integrated circuit comprising:
output means, having an input terminal and an output terminal, to provide a current, for setting said output terminal to a first potential corresponding to a first logic level when the potential applied to said input terminal corresponds to a first predetermined level and setting said output terminal to a second potential corresponding to a second logic level when the potential applied to said input terminal corresponds to a second predetermined level;
conducting means including a transistor and a diode connected in series for conducting the current when the potential of said output terminal becomes equal to a predetermined potential, the predetermined potential being higher than the first potential;
trigger voltage generating means for generating a trigger voltage proportional to the current when said conducting means conducts; and
setting means for setting said input terminal of the output means to one of the first and second potentials when the trigger voltage is applied to said setting means.

* * * * *

UNITED STATES PATENT AND TRADEMARK OFFICE
CERTIFICATE OF CORRECTION

PATENT NO. : 5,053,643

DATED : October 1, 1991

INVENTOR(S) : Tanaka et al.

It is certified that error appears in the above-identified patent and that said Letters Patent is hereby corrected as shown below:

Col. 3, line 54, "VT" should be --$V_T$--;

line 60, "VT" should be --$V_T$--;

line 65, "to" (first occurrence) should be deleted.

Col. 5, line 9, "Equation 3", "Vx=$EB_{06}$+$BV_{EB07}V_{F2}$" should be --Vx=$BV_{EB06}$+$BV_{EB087}$+$V_{F2}$--;

line 18, "$V_f$ and" should be --$V_{F2}$ and--;

line 19, "the" (second occurrence) should be deleted.

Signed and Sealed this

Second Day of March, 1993

Attest:

STEPHEN G. KUNIN

Attesting Officer

Acting Commissioner of Patents and Trademarks